United States Patent [19]

Shibazaki

[11] Patent Number: 6,118,312

[45] Date of Patent: Sep. 12, 2000

[54] CLOCK SWITCH CIRCUIT

[75] Inventor: Shogo Shibazaki, Yokohama, Japan

[73] Assignee: Fujitsu Limited, Kawasaki, Japan

[21] Appl. No.: 09/281,231

[22] Filed: Mar. 30, 1999

[30] Foreign Application Priority Data

Sep. 18, 1998 [JP] Japan .................................. 10-265046

[51] Int. Cl.⁷ .................................................. H03B 19/00
[52] U.S. Cl. ............................ 327/114; 327/115; 327/116
[58] Field of Search .............................. 327/113–122, 39,
327/42, 43, 44–49, 291

[56] References Cited

U.S. PATENT DOCUMENTS

| | | | |
|---|---|---|---|
| 4,623,846 | 11/1986 | LaMacchia | 327/114 |
| 4,891,825 | 1/1990 | Hansen | 327/115 |
| 6,049,236 | 4/2000 | Walden | 327/115 |

FOREIGN PATENT DOCUMENTS 6-53828  2/1994  Japan .

*Primary Examiner*—Toan Tran
*Attorney, Agent, or Firm*—Staas & Halsey LLP

[57] ABSTRACT

A clock circuit which selectively outputs a clock signal of a frequency equal to an integer multiple of a frequency of a master clock signal includes a setting circuit which sets a value corresponding to a target frequency of the clock signal, a counting circuit which counts pulses of the master clock signal, and an extracting circuit which extracts a pulse of the master clock signal each time a counter value of the counting circuit becomes equal to the value set by the setting circuit.

9 Claims, 5 Drawing Sheets

CLOCK SWITCH CIRCUIT

BACKGROUND OF THE INVENTION

1. Field of the Invention

The present invention relates to a circuit which generates a clock signal serving as a basic signal of circuit operations, and more particularly to a clock switch circuit capable of switching the frequency of a clock signal by selecting a desired frequency from among a plurality of frequencies which can be set.

A reduction in the operation speed of a circuit of an information processing apparatus contributes to decreasing power consumed in the circuit. Such a reduction in the operation speed can be achieved by decreasing the frequency of the clock signal which operates the circuit. A clock switch circuit is used to select a clock signal having a desired frequency from among predetermined clock signals having mutually different frequencies.

2. Description of the Related Art

FIG. 1 illustrates a first conventional clock switch circuit, which is made up of a clock generating circuit 51, a setting register 52 and a selector 53. The clock generating circuit 51 generates clock signals CLK0–CLK3 of different frequencies, which are applied to the selector 53. The setting register 52 stores n-bit data, which has a value corresponding to the target clock frequency. The selector 53 selects the clock signal of the target frequency indicated by the n-bit data stored in the setting register 52 from among the clock signals CLK0–CLK3.

Since the clock generating circuit 51 used in the configuration shown in FIG. 1 generates four clock signals CLK0–CLK3, the setting register 52 stores 2-bit data.

FIG. 2 is a time chart of the operation of the first conventional clock switching circuit shown in FIG. 6. A switching operation will be described in which the clock signal is switched from CLK1 to CLK2 and from CLK2 to CLK1.

As long as the 2-bit data stored in the setting register 52 indicates "00" corresponding to the clock signal CLK1, the selector 53 continues to select the clock signal CLK1. A request to switch the clock signal is issued by, for example, the user or a CPU (not shown). If a request to change the clock signal from CLK1 to CLK2 is issued, 2-bit data "01" corresponding to CLK2 is written into the setting register 52. Hence, the selector 53 selects the clock signal CLK2 in response to the change of the 2-bit data stored in the setting register 52.

If a request to return the clock signal from CLK2 to CLK1 is issued, the 2-bit data stored in the setting register 52 is changed to "00" from "01".

The configuration shown in FIG. 1 switches the clock signal at the moment the value of the 2-bit data stored in the setting register 52 is changed. Hence, a hazard may be superimposed on the output signal of the selector 53 when the 2-bit data registered in the setting register 52 is changed, and a circuit which responds to the output signal of the selector 53 may malfunction. For example, if the 2-bit data stored in the setting register 52 is changed to the value corresponding to the target clock signal immediately before the pulse of the above target clock signal falls, a pulse (hazard) having a very short duration will be superimposed on the clock signal selected by the selector 53, as shown in FIG. 2.

There is another problem in the conventional configuration shown in FIG. 1. If an increased number of selectable clock signals is prepared, the clock generating circuit 51 is required to have a larger circuit size. Further, the selector 53 will be required to have a larger size and a complex configuration.

In order to avoid the above-mentioned problems, an improved clock switch circuit capable of generating a desired clock frequency has been proposed in which the pulse of a master clock signal of a constant frequency is extracted each time a given time passes.

FIG. 3 illustrates such an improved clock switch circuit as a second conventional clock switch circuit. The circuit shown in FIG. 3 is made up of a master clock generating circuit 61, a counter 62, a setting register 63 and an AND circuit 64. The master clock generating circuit 61 generates a master clock signal of a given constant frequency. The counter 62 counts the pulses of the master clock signal generated by the master clock generating circuit 61. A value corresponding to the desired clock frequency is stored in the setting register 63. The counter 62 counts the pulses until the number of pulses becomes equal to the value stored in the setting register 63. When the counter 62 counts the number of pulses indicated by the value stored in the setting register 63, the counter 62 outputs a carry signal. The AND circuit 64 performs an AND operation on the carry signal and the clock pulse generated by the master clock generating circuit 61.

Hence, the clock switch circuit shown in FIG. 3 extracts the pulses output by the master clock generating circuit 61 at given intervals based on the value stored in the setting register 63, so that the clock signal having the desired frequency can be generated.

In the configuration shown in FIG. 3, it is enough to generate only one clock signal (master clock signal) of the given constant frequency. Hence, down sizing of the clock switch circuit is achieved. The timing at which the clock signal is switched does not depend on the timing at which the value stored in the setting register 63 is rewritten but is synchronized with the master clock signal.

However, as shown in FIG. 4, the rising and falling edges of the carry signal output by the counter 62 slightly lags behind the rising edges of the pulses of the master clock signal. Hence, the pulses extracted have a slightly reduced width. Further, the pulses to be decimated overlap the carry signal for a very short time. Hence, hazards occur as shown in FIG. 4 even using the improved configuration shown in FIG. 3.

SUMMARY OF THE INVENTION

It is a general object of the present invention to provide a clock switch circuit in which the above disadvantages are eliminated.

A more specific object of the present invention is to provide a clock switch circuit that has a compact size and a large number of selectable frequencies and prevents occurrence of a hazard superimposed on the selected clock signal.

The above objects of the present invention are achieved by a clock circuit which selectively outputs a clock signal of a frequency equal to an integer multiple of a frequency of a master clock signal, said clock circuit comprising: a setting circuit which sets a value corresponding to a target frequency of the clock signal; a counting circuit which counts pulses of the master clock signal; and an extracting circuit which extracts a pulse of the master clock signal with a given delay each time a counter value of the counting circuit becomes equal to the value set by the setting circuit. The given delay functions to absorb the timing difference between the time when the pulse of the master clock signal is extracted and the time when the count operation of the counting circuit is completed. Hence, occurrence of a hazard superimposed on the output clock signal can be prevented.

The clock circuit may be configured so that the extracting circuit comprises a delay circuit which extracts the pulse of the master clock signal when a given time elapses after the counter value of the counting circuit becomes equal to the value set by the setting circuit.

The clock circuit may be configured so that: the counting circuit outputs a carry signal when the counter value becomes equal to the value set by the setting circuit; and the extracting circuit extracts the pulse of the master clock signal in response to the carry signal. Hence, there is a phase difference between the carry signal and the master clock signal. The above phase difference absorbs the practical timing difference between the carry signal and the pulses of the master clock signal so that the pulse width extracted is made equal to that of the pulse of the master clock signal. Hence, there is no possibility that a hazard may occur.

The clock circuit may be configured so that: the counting circuit outputs a carry signal when the counter value becomes equal to the value set by the setting circuit; and the extracting circuit extracts the pulse of the master clock signal when a given time elapses after receiving the carry signal.

The clock circuit may be configured so that: the counting circuit outputs a carry signal when the counter value becomes equal to the value set by the setting circuit; and the extracting circuit includes a delay circuit which delays the carry signal and extracts the pulse of the master clock signal in response to a delayed carry signal from the delay circuit.

The clock circuit may be configured so that the extracting circuit extracts the pulse of the master clock signal while the delayed carry signal is output.

The clock circuit may be configured so that the delay time is equal to or longer than a pulse width of the master clock signal.

The clock circuit may be configured so that: the counting circuit outputs a carry signal when the counter value becomes equal to the value set by the setting circuit; and the counting circuit counts edges of the pulses of the master clock signal; and the extracting circuit includes a flip-flop which latches the carry signal in response to other edges of the master clock signal.

The clock circuit may be configured so that the extracting circuit includes an AND circuit which performs an AND operation on the master clock signal and an output signal of the flip-flop.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
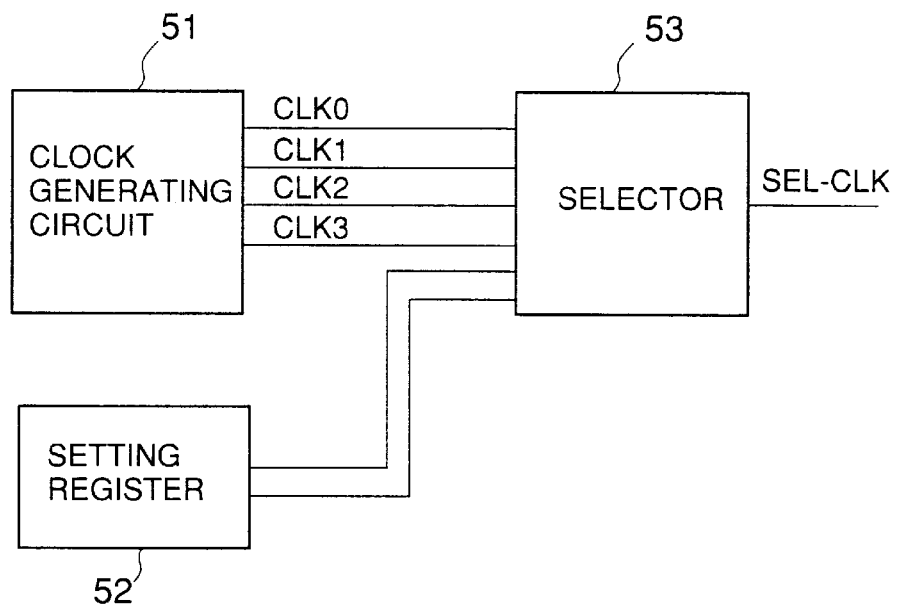
FIG. 1 is a block diagram of a first conventional clock switch circuit.
Figure 2:
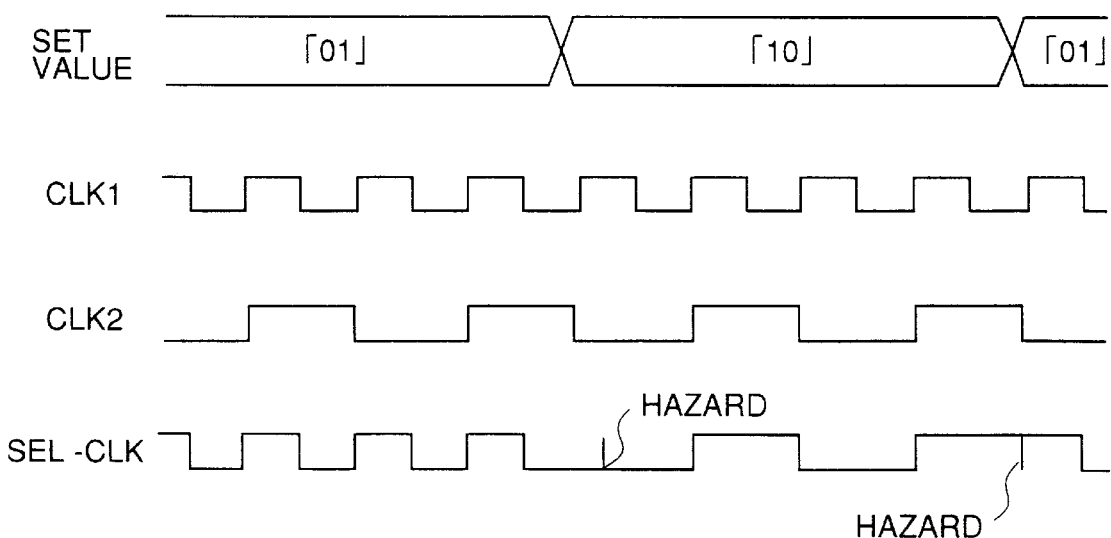
FIG. 2 is a time chart of an operation of the first conventional clock switch circuit shown in FIG. 1.
Figure 3:
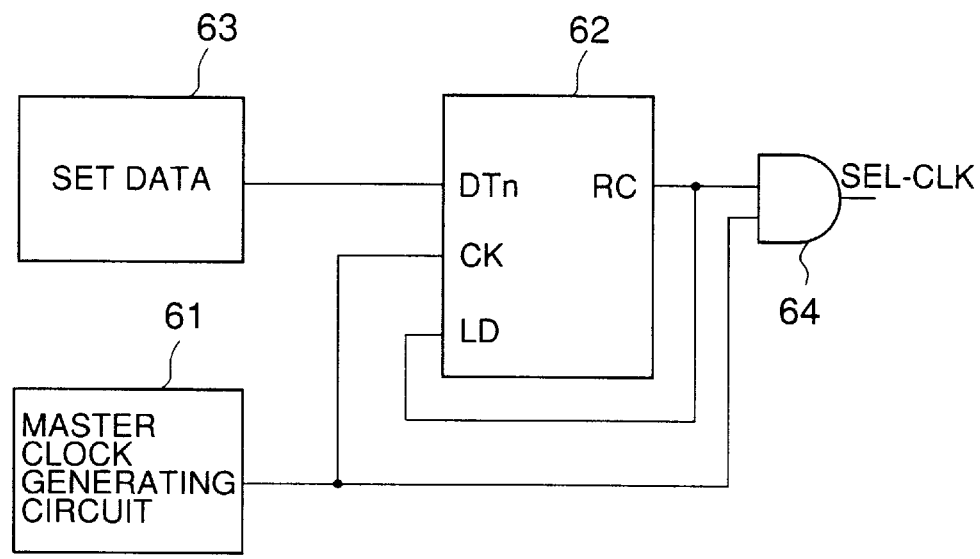
FIG. 3 is a block diagram of a second conventional clock switch circuit.
Figure 4:
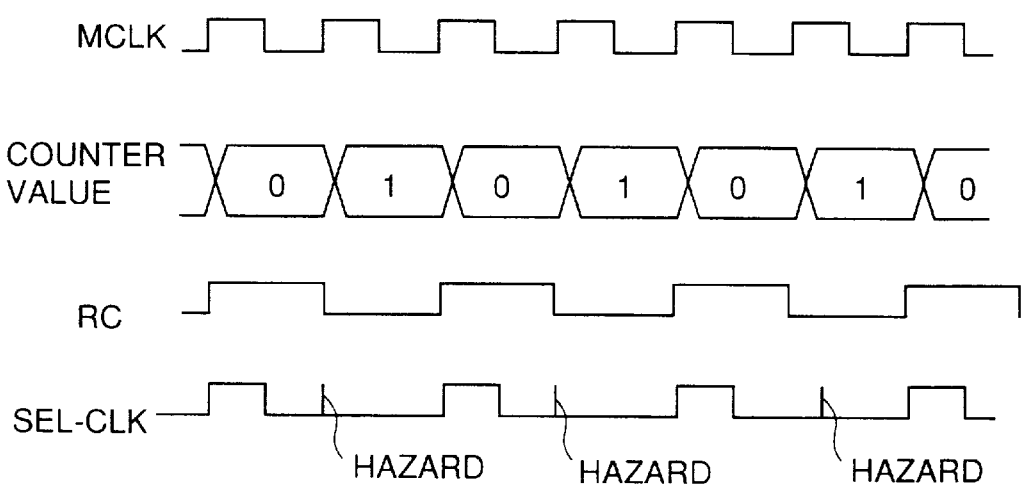
FIG. 4 is a time chart of an operation of the second conventional clock switch circuit shown in FIG. 3.
Figure 5:
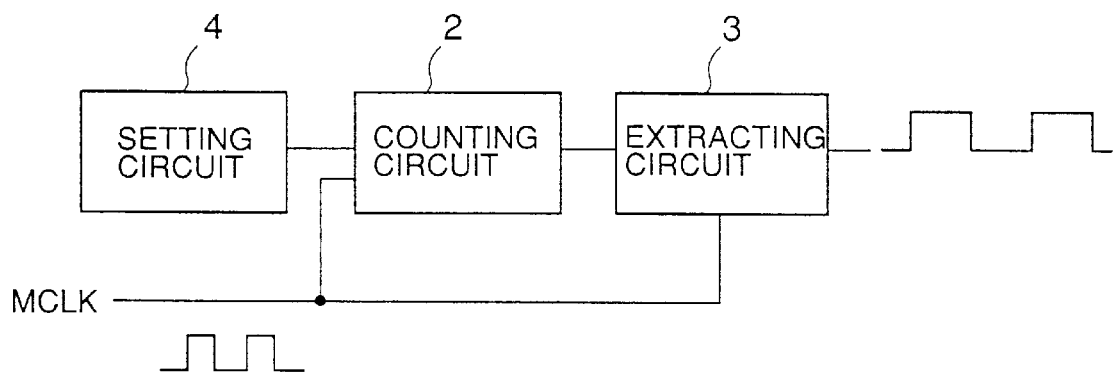
FIG. 5 is a block diagram of an outline of a clock switch circuit of the present invention.

FIG. 5 shows an outline of the clock switch circuit of the present invention. The clock switch circuit shown in FIG. 5 includes a setting circuit 4, a counting circuit 2 and an extracting circuit 3.

The counting circuit 2 counts pulses of a mater clock signal (MCLK) having a constant width and a constant cycle. The setting circuit 4 sets a value corresponding to the clock signal having a desired or target frequency. The counting circuit 2 counts the pulses of the master clock signal until the number of pulses counted becomes equal to the value set by the setting circuit 4. When the number of pulses counted by the counting circuit 2 becomes equal to the value set by the setting circuit 4, the counting circuit 2 outputs a carry signal having the same cycle and width as those of the master clock signal MCLK. The extracting circuit 3 receives the master clock signal MCLK and outputs the pulse of the master clock signal MCLK each time the counting circuit 4 outputs the carry signal.

Figure 6:
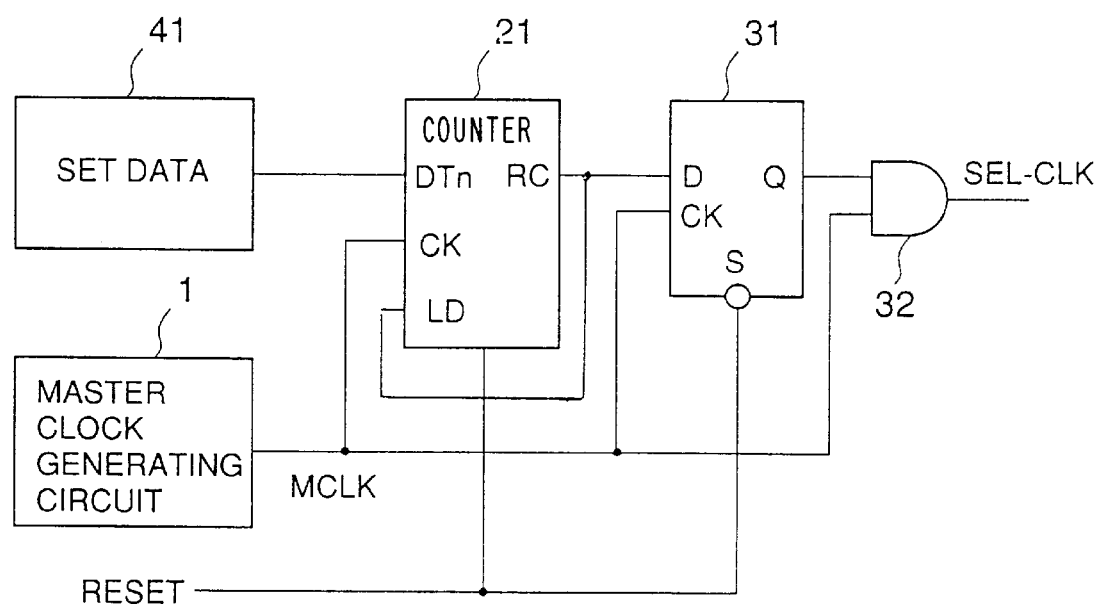
FIG. 6 is a block diagram of a clock switch circuit according to an embodiment of the present invention.

FIG. 6 is a block diagram of a clock switch circuit according to an embodiment of the present invention.

A master clock generating circuit 1 generates the master clock signal MCLK. An n-bit setting register 41 corresponds to the setting circuit 4 shown in FIG. 5. An n-bit counter 21 corresponds to the counting circuit 2 shown in FIG. 5. The setting register 41 stores n-bit data. The nth bit of the n-bit data (n=1, 2, . . . , k) stored in the register 41 is inverted at a data input terminal DTn of the counter 21 and is loaded thereto. The above loading is carried out when the master clock signal become active in a state in which an input to a load terminal LD of the counter 21 is active, that is, the output from a carry terminal RC of the counter 21 is active.

The counter 21 counts up its counter value at the timing when the master clock signal MCLK becomes active, and the output of the carry terminal RC becomes active when all the bits of the counter value are "1". Since the inverted value of the value registered in the setting register 41 is loaded to the counter 21, the carry terminal RC becomes active each time the counter value of the counter 21 becomes equal to the value registered in the setting register 41. When the master clock signal MCLK becomes active with the carry terminal RC active, the data stored in the setting register 41 is loaded to the counter 21 again.

A flip-flop 31 and an AND circuit 32 form the extracting circuit 3 shown in FIG. 5. The flip-flop 31 latches the carry signal output by the counter 21. The AND circuit 32 performs an AND operation on the output of the flip-flop 31 and the master clock signal MCLK. The flip-flop 31 latches the carry signal at the timing of the rising edge of the master clock signal MCLK. That is, the carry signal that is delayed by the pulse width of the master clock signal MCLK is output via an output terminal Q of the flip-flop 31. The carry signal may be delayed by a time longer than the pulse width of the master clock signal MCLK.

The AND circuit 32 performs an AND operation on the signal from the output terminal Q of the flip-flop 31 and the master clock signal MCLK, and outputs the master clock signal MCLK during only the time when the active signal is output from the output terminal Q of the flip-flop 31.

The above-mentioned operation of the clock switch circuit can be summarized so that pulses of the master clock signal MCLK corresponding to the value stored in the setting register 41 are decimated.

Figure 7:
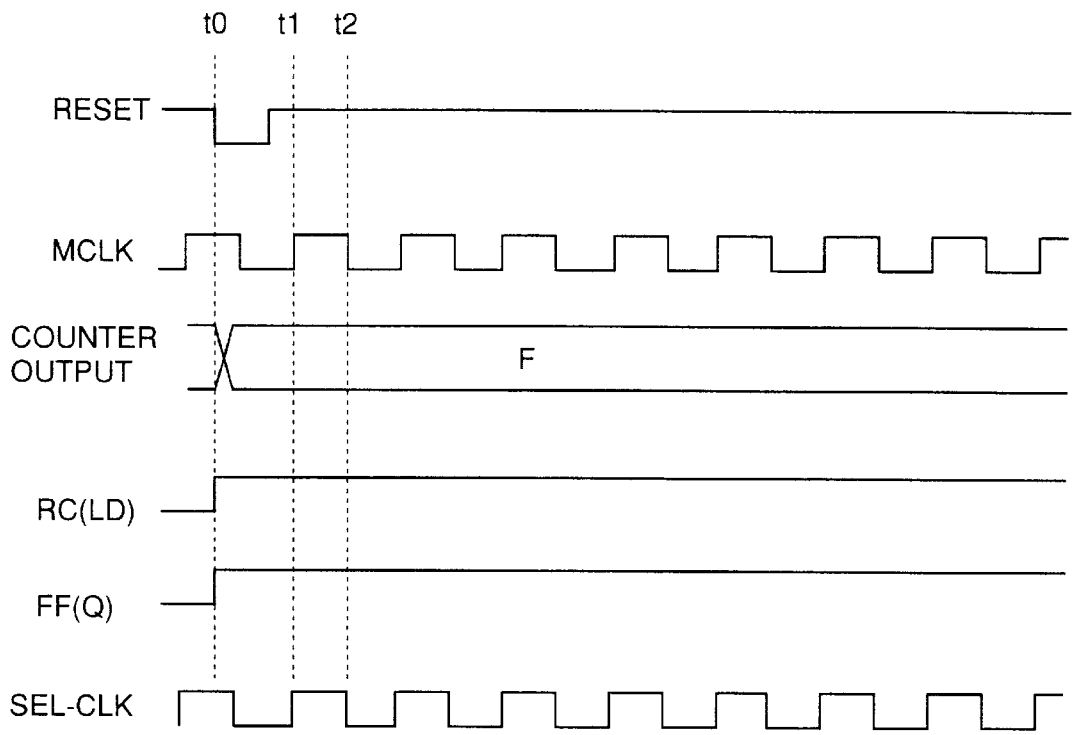
FIGS. 7, 8 and 9 are respectively time charts of operations of the clock switch circuit shown in FIG. 6.
Figure 8:
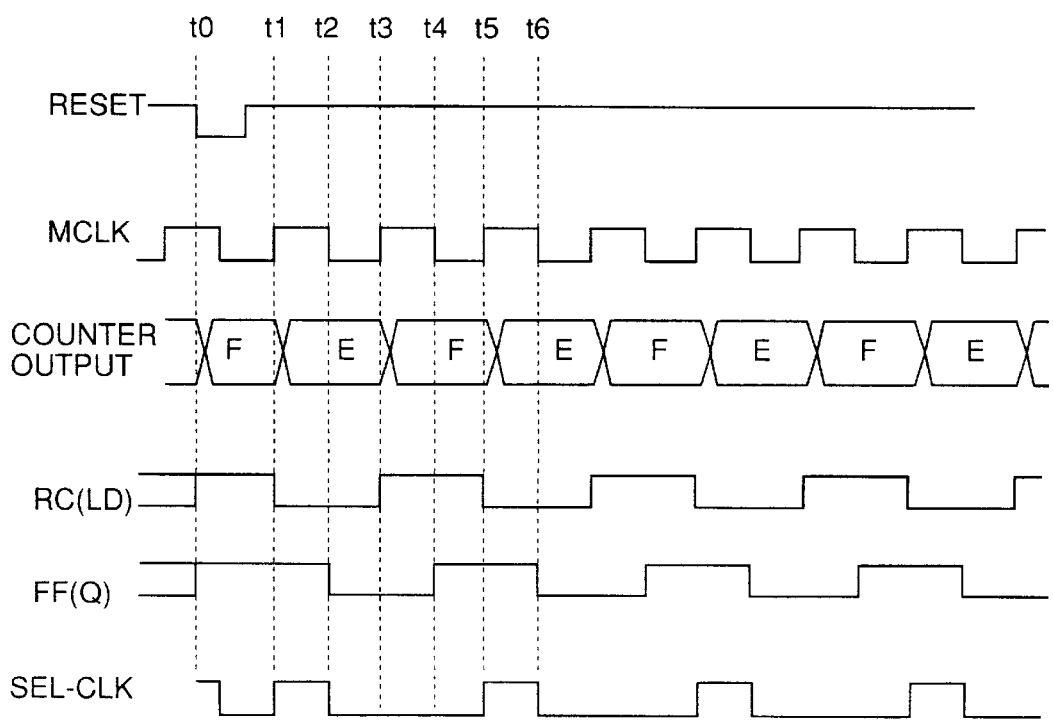
Figure 9:
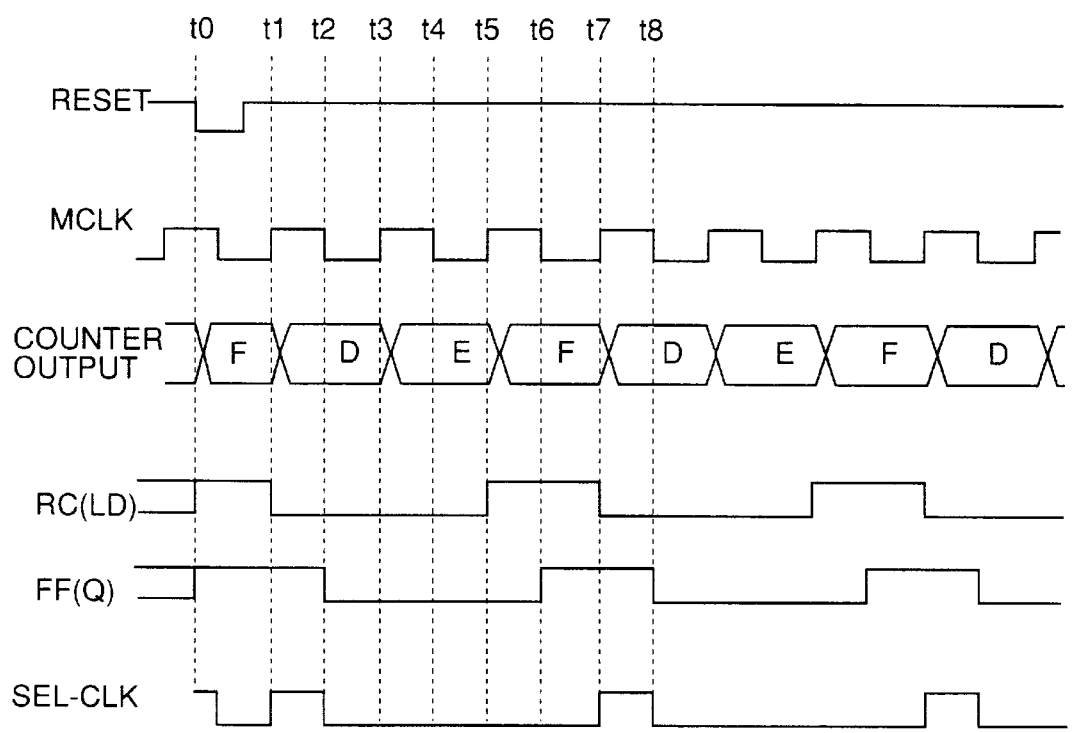

FIGS. 7, 8 and 9 are timing charts of operations of the clock switch circuit shown in FIG. 6. The register 41 shown in FIG. 6 stores 4-bit data, and the counter 21 counts 4-bit data. FIGS. 7, 8 and 9 respectively show operations carried out when the register 41 stores hexadecimal numbers of "0", "1" and "2".

FIG. 7 shows an operation observed when the register 41 stores data "0". At time t0, the counter 21 and the flip-flop 31 are reset, and all the output bits of the counter 21 are active, that is, the output of the counter 21 is "F". Thus, the active signal is output via the carry terminal RC. The active signal is also output via the output terminal Q of the flip-flop 31.

At time t1, the master clock signal MCLK becomes active. At this time, the carry terminal RC is active and thus the load terminal LD is also active. Hence, the inverted value "F" of the value "0" stored in the register 41 is loaded to the counter 21. As a result of this loading, the output of the counter 21 is continuously "F", and the carry terminal RC is maintained in the active state.

At time t2, the master clock signal MCLK becomes negative, and the flip-flop 31 latches the signal output via the carry signal RC. Since the carry terminal RC is in the active state at time t2, the output terminal Q of the flip-flop 31 is maintained in the active state.

Thereafter, each time the master clock signal MCLK becomes active, the inverted value "F" of the value "0" stored in the register 41 is loaded to the counter 21. Hence, the carry signal RC of the counter 21 is maintained in the active state. Hence, the output terminal Q of the flip-flop 31 is continuously maintained in the active state, and one of the two inputs of the AND circuit 32 is always active. Thus, the master clock signal MCLK applied to the AND circuit 32 is not decimated, and the clock switch circuit outputs, as the clock signal, the master clock signal MCLK via the AND circuit 32.

FIG. 8 shows an operation observed when the register 41 stores data "1". At time t0, the counter 21 and the flip-flop 31 are reset, and all the output bits of the counter 21 are active, that is, the output of the counter 21 is "F". Thus, the active signal is output via the carry terminal RC. The active signal is also output via the output terminal Q of the flip-flop 31.

At time t1, the master clock signal MCLK becomes active. At this time, the carry terminal RC is active and thus the load terminal LD is also active. Hence, the inverted value "E" of the value "1" stored in the register 41 is loaded to the counter 21. As a result of this loading, the output of the counter 21 is continuously "E", and the carry terminal RC is switched to the negative state.

At time t2, the master clock signal MCLK becomes negative, and the flip-flop 31 latches the signal output via the carry signal RC. Since the carry terminal RC is in the negative state at time t2, the output terminal Q of the flip-flop 31 is switched to the negative state.

At time t3, the master clock signal MCLK becomes active and the counter 21 performs the count-up operation so that the counter value changes from "E" to "F" and the carry terminal RC is switched to the active state.

At time t4, the master clock signal MCLK becomes negative, and the flip-flop 31 latches the signal output from the carry terminal RC. However, at time t4, the carry terminal RC is in the active state. Thus, the output terminal Q of the flip-flop 31 is changed to the active state.

At time t5, the master clock signal MCLK becomes active. At this time, the carry terminal RC is active and the load terminal LD is thus active. Thus, the inverted value "E" of the value "1" stored in the register 41 is loaded to the counter 21. Hence, the output of the counter 21 becomes "E" and the carry terminal RC is inverted to the negative state.

At time t6, the master clock signal MCLK becomes negative, and the flip-flop 31 latches the signal output via the carry terminal RC of the flip-flop 31. However, at time t6, the carry terminal RC is in the negative state. Thus, the output terminal Q of the flip-flop 31 is changed to the negative state.

As described above, when "1" is set in the register 41, the carry terminal RC becomes active with a cycle equal to twice the cycle of the master clock signal MCLK, and the output terminal Q of the flip-flop 31 becomes active with a cycle equal to twice the cycle of the master clock signal MCLK. Hence, the AND circuit 32 outputs, as the clock signal, the master clock signal MCLK for every other pulse.

FIG. 9 illustrates an operation observed when the register 41 stores data "2". At time t0, the counter 21 and the flip-flop 31 are reset, and all the output bits of the counter 21 are active, that is, the output of the counter 21 is "F". Thus, the active signal is output via the carry terminal RC. The active signal is also output via the output terminal Q of the flip-flop 31.

At time t1, the master clock signal MCLK becomes active. At this time, the carry terminal RC is active and thus the load terminal LD is also active. Hence, the inverted value "D" of the value "2" stored in the register 41 is loaded to the counter 21. As a result of this loading, the output of the counter 21 is continuously "D", and the carry terminal RC is switched to the negative state.

At time t2, the master clock signal MCLK becomes negative, and the flip-flop 31 latches the signal output via the carry signal RC. Since the carry terminal RC is in the negative state at time t2, the output terminal Q of the flip-flop 31 is switched to the negative state.

At time t3, the master clock signal MCLK becomes active and the counter 21 performs the count-up operation so that the counter value changes from "D" to "E" and the carry terminal RC is maintained in the negative state.

At time t4, the master clock signal MCLK becomes negative, and the flip-flop 31 latches the signal output from the carry terminal RC. However, at time t4, the carry terminal RC is in the negative state. Thus, the output terminal Q of the flip-flop 31 is maintained in the negative state.

At time t5, the master clock signal MCLK becomes active. The counter 21 performs the count up operation. Hence, the output of the counter 21 is changed from "E" to "F", and the carry terminal RC is switched to the active state.

At time t6, the master clock signal MCLK becomes negative, and the flip-flop 31 latches the signal output via the carry terminal RC of the flip-flop 31. However, at time t6, the carry terminal RC is in the active state. Thus, the output terminal Q of the flip-flop 31 is changed to the active state.

At time t7, the master clock signal MCLK become active. At this time, the carry terminal RC is active and the load terminal LD is thus active. The inverted value "D" of value "2" stored in the register 41 is loaded to the counter 21. Hence, the output of the counter 21 becomes "D" and the carry terminal RC is inverted to the negative state.

At time t8, the master clock signal MCLK becomes negative and the flip-flop 31 latches the signal output via the carry terminal RC. However, at time t8, the carry terminal RC is in the negative state, and the output terminal Q of the flip-flop 31 is thus changed to the negative state.

As described above, when "2" is set in the register 41, the carry terminal RC becomes active with a cycle equal to three times the cycle of the master clock signal MCLK, and thus the output terminal Q of the flip-flop 31 becomes active with a cycle equal to the three times the cycle of the master clock signal MCLK. Hence, the AND circuit 32 outputs, as the clock signal, the master clock signal MCLK for every two pulses.

The above-mentioned embodiment of the present invention employs the counter 21 of the count-up type, in which the counter value becomes "F" when the counter value of the counter 21 becomes equal to the value stored in the register 41. Alternatively, the counter 21 may be formed of a counter of a count-down type. In this case, the counter 21 counts down the value stored in the register 41, and outputs the carry signal when the counter value becomes equal to "0".

According to the present invention, pulses of the master clock signal are extracted at given intervals which can be adjusted so that the clock signal having a desired frequency equal to an integer multiple of the frequency of the master clock signal can be obtained. Hence, there is no need to employ a circuit which simultaneously generates a plurality of clock signals and a circuit selecting a desired one of the clock signals. Hence, the clock switch circuit of the present invention can be down sized. The timing at which the pulse of the master clock signal is extracted is determined so that the timing is not located immediately before the falling edge of the pulse of the master clock signal and immediately after the rising edge thereof. Hence, no hazard occurs. Hence the normal operations of a circuit and an apparatus can be ensured and improved reliability can be obtained.

The present invention is not limited to the specifically disclosed embodiments, and variations and modifications may be made without departing from the scope of the present invention.

What is claimed is:

1. A clock circuit which selectively outputs a clock signal of a frequency equal to an integer multiple of a frequency of a master clock signal, said clock circuit comprising:

a setting circuit which sets a value corresponding to a target frequency of the clock signal;

a counting circuit which counts pulses of the master clock signal; and an extracting circuit which extracts a pulse of the master clock signal with a given delay each time a counter value of the counting circuit becomes equal to the value set by the setting circuit.

2. The clock circuit as claimed in claim 1, wherein the extracting circuit comprises a delay circuit which extracts the pulse of the master clock signal when a given time elapses after the counter value of the counting circuit becomes equal to the value set by the setting circuit.

3. The clock circuit as claimed in claim 1, wherein:

the counting circuit outputs a carry signal when the counter value becomes equal to the value set by the setting circuit; and the extracting circuit extracts the pulse of the master clock signal in response to the carry signal.

4. The clock circuit as claimed in claim 1, wherein:

the counting circuit outputs a carry signal when the counter value becomes equal to the value set by the setting circuit; and the extracting circuit extracts the pulse of the master clock signal when a given time elapses after receiving the carry signal.

5. The clock circuit as claimed in claim 1, wherein:

the counting circuit outputs a carry signal when the counter value becomes equal to the value set by the setting circuit; and the extracting circuit includes a delay circuit which delays the carry signal and extracts the pulse of the master clock signal in response to a delayed carry signal from the delay circuit.

6. The clock circuit as claimed in claim 5, wherein the extracting circuit extracts the pulse of the master clock signal while the delayed carry signal is output.

7. The clock circuit as claimed in claim 2, wherein the delay time is equal to or longer than a pulse width of the master clock signal.

8. The clock circuit as claimed in claim 1, wherein:

the counting circuit outputs a carry signal when the counter value becomes equal to the value set by the setting circuit; and the counting circuit counts edges of the pulses of the master clock signal; and the extracting circuit includes a flip-flop which latches the carry signal in response to other edges of the master clock signal.

9. The clock circuit as claimed in claim 8, wherein the extracting circuit includes an AND circuit which performs an AND operation on the master clock signal and an output signal of the flip-flop.

* * * * *